(12) United States Patent
Hiura et al.

(10) Patent No.: US 7,274,435 B2
(45) Date of Patent: Sep. 25, 2007

(54) EXPOSURE APPARATUS AND DEVICE FABRICATION METHOD USING THE SAME

(75) Inventors: Mitsuru Hiura, Tochigi (JP); Toshihiko Tsuji, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 10/512,312

(22) PCT Filed: Apr. 11, 2003

(86) PCT No.: PCT/JP03/04644

§ 371 (c)(1),
(2), (4) Date: Oct. 22, 2004

(87) PCT Pub. No.: WO03/092056

PCT Pub. Date: Nov. 6, 2003

(65) Prior Publication Data

US 2005/0225739 A1 Oct. 13, 2005

(30) Foreign Application Priority Data

Apr. 26, 2002 (JP) ............................. 2002-127343
Mar. 18, 2003 (JP) ............................. 2003-073637

(51) Int. Cl.
*G03B 27/54* (2006.01)
*G03B 27/42* (2006.01)
(52) U.S. Cl. .......................................... 355/67; 355/53
(58) Field of Classification Search ................. 355/67, 355/53; 378/119, 143, 34; 250/305, 492.2

See application file for complete search history.

(56) References Cited

U.S. PATENT DOCUMENTS 6,031,598 A 2/2000 Tichenor et al.

(Continued)

FOREIGN PATENT DOCUMENTS

EP 0 987 601 A2 3/2000

(Continued)

OTHER PUBLICATIONS

International Searching Authority; Japanese Patent Office; "PCT International Search Report"; corresponding to International Application No. PCT/JP03/04644; date of mailing Jul. 29, 2003; (3 pages).

(Continued)

*Primary Examiner*—Peter B. Kim
(74) *Attorney, Agent, or Firm*—Morgan & Finnegan LLP

(57) ABSTRACT

An exposure apparatus that irradiates excitation laser onto a target, and generates from generated plasma a light source for generating illumination light of an extreme ultraviolet region or an X-ray region includes an illumination optical system that uses the illumination light to illuminate a catoptric reticle that forms a pattern to be transferred, the illumination optical system including a first mirror closest to the light source, an ellipsoidal mirror for condensing the illumination light in front of the first mirror in the illumination optical system, and a projection optical system that reduces and projects the pattern reflected on the reticle onto an object to be exposed, wherein light where an optical-axis direction of the excitation laser proceeds beyond a position that generates the plasma by the excitation laser does not interfere with components in the exposure apparatus including the illumination and projection optical systems, and the ellipsoidal mirror.

6 Claims, 13 Drawing Sheets

U.S. PATENT DOCUMENTS

| | | |
|---|---|---|
| 6,118,577 A | 9/2000 | Sweatt et al. |
| 6,285,743 B1 | 9/2001 | Kondo et al. |
| 6,522,716 B1 | 2/2003 | Murakami et al. |
| 6,545,272 B1 | 4/2003 | Kondo |

FOREIGN PATENT DOCUMENTS

| | | |
|---|---|---|
| JP | 2000-89000 A | 3/2000 |
| JP | 2000-100685 A | 4/2000 |
| JP | 2000-346817 A | 12/2000 |
| JP | 2001-110709 A | 4/2001 |
| JP | 2001-332489 A | 11/2001 |
| JP | 2003-8124 A | 1/2003 |

OTHER PUBLICATIONS

Korean Search Report and translation thereof, dated Mar. 22, 2006. (The referenced patents were previosly submitted on Oct. 22, 2004 with the original specification.).

EXPOSURE APPARATUS AND DEVICE FABRICATION METHOD USING THE SAME

This application claims the right of priority based on Japanese Patent Applications Nos. 2002-127343, filed on Apr. 26, 2002, and 2003-73637, filed on Mar. 18, 2003, which are hereby incorporated by reference herein in their entirety as if fully set forth herein.

TECHNICAL FIELD

The present invention relates generally to exposure apparatuses and device fabrication methods, and more particularly to an extreme ultraviolet ("EUV") exposure apparatus used for a lithography process for manufacturing devices, e.g., semiconductor devices, such as ICs and LSIs, liquid crystal devices, image-pickup devices, such as CCDs, and magnetic heads.

BACKGROUND ART

Along with recent demands for smaller and lower profile electronic devices, finer semiconductor devices to be mounted onto these electronic devices have been increasingly demanded. Conventionally, a lithography method for manufacturing a semiconductor device has used a reduction projection exposure using ultraviolet ("UV") light, but the minimum critical dimension transferable in the reduction projection exposure is in proportion to a wavelength of light used for transfer and in reverse proportion to a numerical aperture ("NA") of a projection optical system. In order to transfer finer circuit patterns, a wavelength of used exposure light has been shortened from an i-line mercury lamp (with a wavelength of 365 nm) to KrF excimer laser (with a wavelength of 248 nm) and ArF excimer laser (with a wavelength of approximately 193 nm).

However, as the semiconductor device has rapidly become finer, the lithography using the UV light has a limited resolution. Accordingly, in order to efficiently print a very fine circuit pattern below 0.1 µm, a projection exposure apparatus has developed that uses EUV light having a wavelength between 10 and 15 nm, which is much smaller than that of the UV light.

The EUV light source uses, for example, a laser plasma light source. It uses YAG laser, etc. to irradiate a highly intensified pulse laser beam to a target material put in a vacuum chamber, thus generating high-temperature plasma for use as EUV light with a wavelength of about 13.5 nm emitted from this. The target material may use a metallic thin film, inert gas, and droplets, etc., and supplied to the vacuum chamber by gas jetting means and other means. The higher repetitive frequency of the pulse laser, e.g., repetitive frequency of typically several kHz, is preferable for the increased average intensity of the EUV light.

Japanese Patent Application Publications Nos. 5-217858, 8-236292, 11-40479, and U.S. Pat. No. 5,335,258 teach use of solid materials as the target material, while U.S. Pat. No. 5,459,771 teaches use of droplets as the target material. Japanese Patent Application Publications Nos. 2003-43196 (corresponding to U.S. Patent Application Publication No. U.S. 2002/0162975 A1), 2000-110709, 2002-8891 and 2000-346817 teach use of a paraboloid-of-revolution mirror as a mirror for condensing the EUV light emitted from the generated plasma, while Japanese Patent Application Publications Nos. 2000-91209 (corresponding to U.S. Pat. No. 6,266,389) and 2001-332489 teach use of a ellipsoidal mirror.

The pulse laser beam with high intensity generates, when irradiating the target, flying particles called debris as well as the EUV light. The debris when adhering to an optical element causes pollution, damages and lowered reflectance, and thus debris removal means has conventionally been proposed to prevent the debris from reaching an optical element from the target. For example, a debris filter as one exemplary debris removal means is made of molybdenum, beryllium, zirconium, etc., and the transmittance to the EUV light is set between about 50% and 70%.

For easier prevention of the debris from entering the illumination optical system, it is preferable that the condenser mirror of the EUV light uses an ellipsoidal mirror that has one focal point where the plasma occurs, and another focal point for condensing light, as well as physically narrowing a path between the light source and the illumination system.

In principle, the EUV light is isotropically emitted from the plasma, and thus may be efficiently condensed when a cover angle of the condenser ellipsoidal mirror is made larger.

An illumination optical system that illuminates a target area using the EUV light is arranged below the emission point of the EUV light, and the conventional exposure apparatus arranges a laser light source such that an optical axis of the excitation laser accords with that of the EUV light incident upon the first mirror in the illumination optical system.

Due to vibrations and mechanical deformations, the excitation laser may go wide of the target entirely or partially. Due to causes other than a positional offset between the excitation laser and the target, the excitation laser may entirely or partially cross the emission point. When the excitation laser that crosses the emission point goes straight ahead and reaches the illumination optical system, it thermally deforms the first and subsequent mirrors or thermally destroys the multilayer on the mirror, lowering the resolution and hindering high-quality exposure. A repair and replacement of the mirror remarkably lowers the working efficiency of the apparatus since the illumination and projection optical systems are housed in a vacuum chamber. It is conceivable to considerably decrease a beam diameter of the laser light such that the excitation laser falls within the target even when it offsets slightly, but this undesirably decreases the power of the EUV light and lowers the throughput.

The above debris filter has transmittance between about 50% and 70% to the EUV light, but transmittance to a laser beam from YAG laser of about 100%. Therefore, the conventional debris filter has been insufficient to shield the laser beam that goes straight ahead beyond the EUV emission point.

Another conventional exposure apparatus arranges the laser light source such that an optical axis of the EUV light incident upon the first mirror in the illumination optical system does not accord with an optical axis of the excitation laser. However, this exposure apparatus restricts the cover angle of the condenser mirror so as to maintain the introduction space of the excitation laser to the target, and does not sufficiently high emission efficiency of the EUV light.

The prior art does not teach a large cover angle of the condenser ellipsoidal mirror, directions of the excitation laser incident onto a target and exiting the target, or interference between the excitation laser and the illumination system including the ellipsoidal mirror.

DISCLOSURE OF INVENTION

Accordingly, it is an exemplified object of the present invention to provide an exposure apparatus and device fabrication method using the same, which uses an ellipsoidal mirror as a condenser mirror to condense the EUV light into one point, increases its cover angle or size, and prevents the laser beam that goes straight ahead beyond a target from damaging optical elements including the ellipsoidal mirror for high-quality exposure without lowering the throughput.

An exposure apparatus according to one aspect of the present invention that irradiates excitation laser onto a target, and generates from generated plasma a light source for generating illumination light of an extreme ultraviolet region or an X-ray region includes an illumination optical system that uses the illumination light to illuminate a catoptric reticle that forms a pattern to be transferred, the illumination optical system including a first mirror closest to the light source, an ellipsoidal mirror for condensing the illumination light in front of the first mirror in the illumination optical system, and a projection optical system that reduces and projects the pattern reflected on the catoptric reticle onto an object to be exposed, wherein light where an optical-axis direction of the excitation laser proceeds beyond a position that generates the plasma by the excitation laser does not interfere with components in the exposure apparatus including the illumination and projection optical systems, and the ellipsoidal mirror.

An optical axis of the excitation laser may be offset from an optical-axis direction of the illumination light that enters the first mirror in the illumination optical system.

The excitation laser incident upon the target and the excitation laser exiting the target may pass through passage part provided in the ellipsoidal mirror. The excitation laser incident upon the target may pass through passage part provided in the ellipsoidal mirror, and the excitation laser exiting the target may pass through an opening of the ellipsoidal mirror through which the illumination light passes. The excitation laser exiting the target may pass through passage part in the ellipsoidal mirror, and the excitation laser incident upon the target may pass through an opening of the ellipsoidal mirror through which the illumination light passes.

The exposure apparatus may further include a mechanism for three-dimensionally inclining the optical-axis direction of the excitation laser relative to an optical-axis direction of the illumination light. The exposure apparatus may further include a light-shielding member that prevents the excitation laser from reaching the illumination optical system beyond the target. The exposure apparatus may further include a debris removal member that prevents debris that is generated at an emission point of the plasma from reaching the illumination optical system. The exposure apparatus may further include a light-shielding member that prevents the excitation laser from reaching the illumination optical system beyond the target, the light-shielding member having transmittance of about 10% or less to the excitation laser, and a debris removal member that prevents debris that is generated at an emission point of the plasma from reaching the illumination optical system, the debris removal member having transmittance of about 90% or higher to the excitation laser. The light-shielding member may include a metal member and an antireflective coating on the metal member.

An angle of an optical axis of the excitation laser relative to an optical-axis direction of the illumination light may be determined such that the light from the excitation laser that proceeds beyond the light source may not be irradiated onto the outermost element in the exposure apparatus when viewed from the light source from the optical-axis direction of the illumination light incident upon the first mirror to the optical-axis direction of the excitation laser. The exposure apparatus may further include a cooling mechanism for cooling the light-shielding member. The light-shielding member may be located outside a chamber that houses the illumination and projection optical systems. An opening of the ellipsoidal mirror through which the illumination light passes, may be located closer to the first mirror than a condensing point of the excitation laser in an optical-axis direction of the illumination light.

An exposure apparatus of another aspect of the present invention that irradiates excitation laser onto a target, and generates from generated plasma a light source for generating illumination light of an extreme ultraviolet region or an X-ray region includes an illumination optical system that uses the illumination light to illuminate a catoptric reticle forming a pattern, the illumination optical system including a first mirror closest to the light source, a condenser mirror for introducing the illumination light to the first mirror in the illumination optical system, and a projection optical system that reduces and projects the pattern reflected on the catoptric reticle onto an object to be exposed, wherein an opening of the condenser mirror through which the illumination light passes, is located closer to the first mirror than a condensing point of the excitation laser in an optical-axis direction of the illumination light, and wherein light where an optical-axis direction of the excitation laser proceeds beyond a position that generates the plasma by the excitation laser does not interfere with components in the exposure apparatus including the illumination and projection optical systems, and the condenser mirror. The condenser mirror may be an ellipsoidal mirror.

A device fabricating method of still another aspect of the present invention includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BEST MODE FOR CARRYING OUT THE INVENTION

First Embodiment

Figure 1:
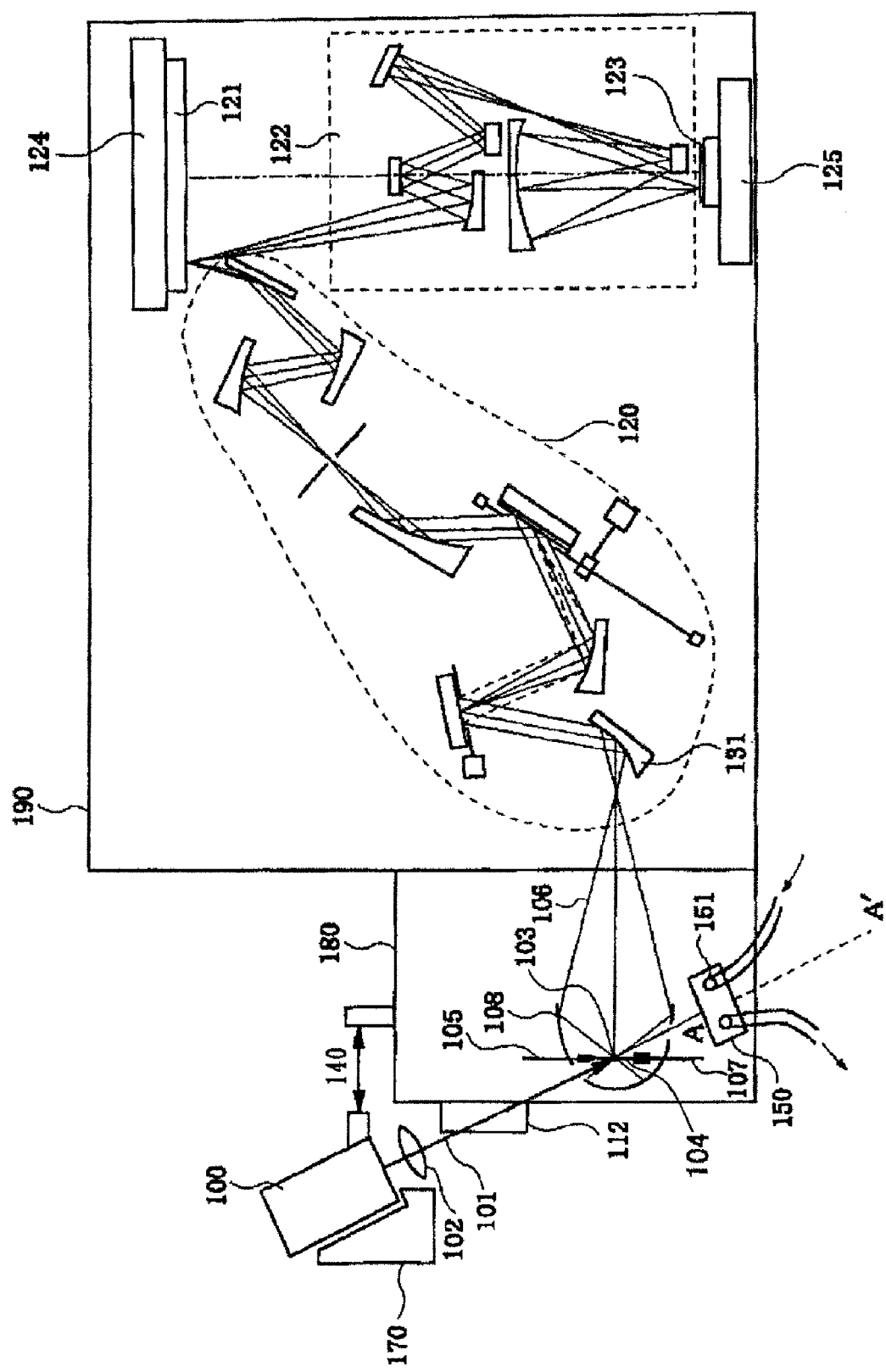
FIG. 1 is a schematic plane view of an exposure apparatus of a first embodiment according to the present invention.

A description will now be given of an EUV exposure apparatus of a first embodiment according to the present invention, with reference to FIG. 1. FIG. 1 is a schematic plane view of the EUV exposure apparatus. The inventive exposure apparatus is an exposure apparatus that uses EUV light having a wavelength between 10 and 15 nm smaller than that of the UV light (e.g., with a wavelength of 13.5 nm) as exposure light for scan-type exposure.

Referring to FIG. 1, the exposure apparatus includes a laser plasma light source part, an illumination optical system 120, a catoptric reticle 121, a projection optical system 122, a reticle stage 124, a wafer 123, and a wafer stage 125, and accommodates the illumination optical system 120 to the wafer stage 125 in the vacuum chamber 190.

The laser plasma light source of the instant embodiment irradiates a highly intensified pulse laser beam 101 from a laser light source 100 through a condenser optical system 102 to a target 104 supplied at a condensing point 103 by a target supply system 105 accommodated in a vacuum chamber 180, thus generating high-temperature plasma for use as EUV light with a wavelength of about 13.5 nm emitted from this. More specifically, the laser plasma light source irradiates high intensity excitation pulse laser 101 onto the target 104, and excites the target 104 in a high-temperature plasma state. The condenser mirror 108 condenses the EUV light from among light of a wave range from the infrared light to UV light and EUV light so as to use the EUV light as exposure light.

As described above, for easy prevention of the debris that is generated with the EUV light, from entering the illumination optical system, it is preferable that the condenser mirror of the EUV light uses an ellipsoidal mirror that has one focal point where the plasma occurs, and another focal point for condensing light, and physically narrows a path between the light source and the illumination system.

In addition, for desired power of the EUV light and enhanced productivity of the exposure apparatus or throughput, the EUV light emitted from the plasma should be condensed efficiently. This is achieved by condensing the emitted EUV light with a large cover solid angle, and this purpose requires a large condenser mirror.

The pulse laser beam 101 is derived, for example, from Nd: YAG laser, excimer laser, etc. The vacuum chamber 180 maintains a vacuum atmosphere environment for the EUV light that has small transmittance to the air. The pulse laser beam 101 is condensed at the condensing position 103 through a window 112 provided in the vacuum chamber 180. Preferably, the window 112 is made of quarts, etc. that have large transmittance to the pulse laser beam 101.

The target 104 depends upon a wavelength of the generated EUV light, and may use a metallic thin film, such as Cu, Li, and Zn, inert gas, such as Xe, and droplets, etc., and supplied by the target supply system 105, such as gas jet into the vacuum chamber 180. Among them, Xe is a potent candidate as the target 104 for reasons including the debris that is generated with the EUV light and would disadvantageously pollute other illumination systems, conversion efficiency from the excitation pulse laser 101 to the EUV light 106, and handling convenience of the target 104. A target recovery system 107 is provided to recover the target 104 since all of supplied target 104 does not necessarily contribute to the plasma generation.

Figure 5A:
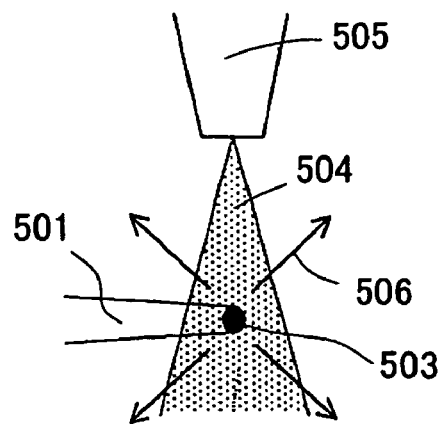
FIG. 5 is a view for explaining a supply of a target near a plasma light source.
Figure 5B:
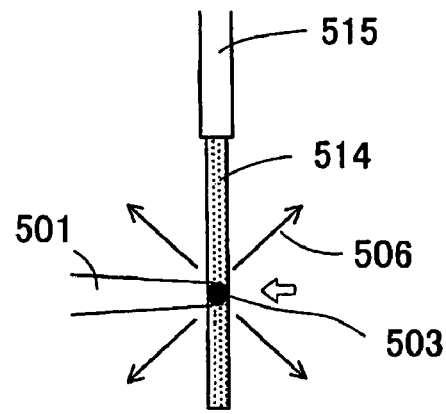
Figure 5C:
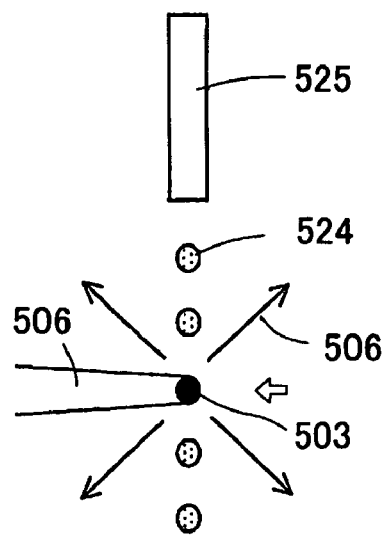

Referring to FIG. 5, a description will be given of a supply method of Xe as the target 104 to the condensing position 103. In FIG. 5A, a nozzle 505 jets Xe gas 504, and the condensed pulse laser beam 501 generates EUV light 506 at a condensing point 503 when the high temperature plasma cools. In FIG. 5B, a nozzle 515 jets Xe liquid 514 like a rod, and the condensed pulse laser beam 501 similarly generates EUV light 506 at a condensing point 503 when the high temperature plasma cools. In FIG. 5C, a nozzle 525 drops Xe droplets 524 under synchronous control such that when the Xe droplet 524 reaches the emission point 503, the pulse laser beam 501 reaches the emission point 503. As a result, the EUV light 506 occurs when the high temperature plasma cools.

In general, the Xe density should be increased for enhanced conversion efficiency from the pulse laser to the EUV light, and liquid forms shown in FIGS. 5B and 5C are a more preferable supply method than a gas form shown in FIG. 5A. Nevertheless, even the Xe liquid produces the conversion efficiency from the pulse laser beam 101 to the EUV light 106 of a little over 1% at most. For the improved productivity or throughput, an EUV light source is required to produce the EUV light with power of 50 to 150 W. Therefore, the pulse laser that excites the plasma needs such large power as 5 to 15 kW.

The target supply system 105 is housed in the vacuum chamber 180. The laser light source 100 is such a large unit that it has a large output of 5 to 15 kW class, and mounted on a support rack (not shown) different from the vacuum chamber 180. This requires high alignment accuracy between the pulse laser beam 101 emitted from the laser light source 100 and the Xe target system 104, and precise synchronous control between an emission timing of the pulse laser 501 and a drop timing of the liquid target 524 in the target supply system shown in FIG. 5C.

The alignment may provide, for example, an interferometer system 140 to the laser light source 100 and the vacuum chamber 180, and detect a positional offset between them. The precise alignment of positions between the pulse laser 100 and the target 104 may be achieved by using an actuator (not shown) to drive an optical element (not shown) for controlling a position of the laser light source or the pulse laser beam 101.

However, the interferometer system 140 does not measure a position of the pulse laser beam 101 at the condensing point 103 and a position of the target 104 at the condensing point 103, and thus it is difficult to accurately align the pulse laser beam 101 with the target 101 at the condensing point 103. Therefore, the vibrations, mechanical deformations, etc. generate a positional offset between them.

Figure 6A:
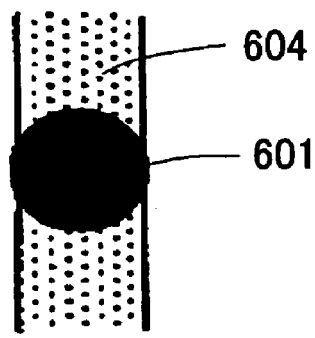
FIG. 6 is a schematic view for explaining an example that uses excitation laser to irradiate the target.
Figure 6B:
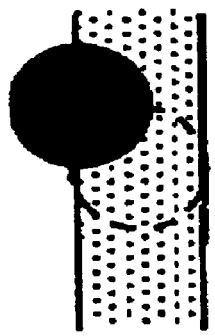
Figure 6C:
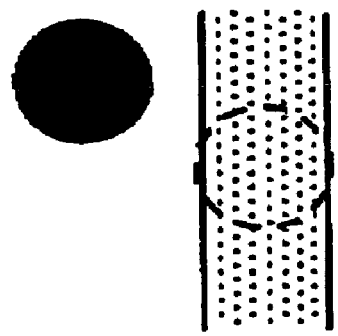

FIG. 6 shows a relationship between a pulse laser beam 601 and a target 604 in the target supply system shown in FIG. 5B when viewed from an arrow direction. Without a positional offset, a center of the pulse laser beam 601 and a center of the rod-shaped target 604 accords with each other as shown in FIG. 6A. With a slight positional offset, the pulse laser beam 601 partially irradiates the target 604 as shown in FIG. 6B. With a significant positional offset, the pulse laser beam 601 does not irradiate the target 604 as shown in FIG. 6C.

Similarly, FIG. 7 shows a relationship between a pulse laser beam 701 and a target 704 in the target supply system shown in FIG. 5C when viewed from an arrow direction. Without a positional offset, a center of the pulse laser beam 701 and a center of the liquid target 704 accords with each other as shown in FIG. 7A. With a slight positional offset, the pulse laser beam 701 partially irradiates the target 704 as shown in FIG. 7B. With a significant positional offset, the pulse laser beam 701 does not irradiate the target 704 as shown in FIG. 7C.

Figure 7A:
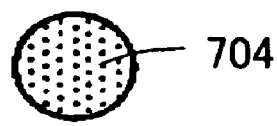
FIG. 7 is another schematic view for explaining an example that uses excitation laser to irradiate the target.
Figure 7A:
Figure 7A:
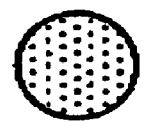
Figure 7B:
Figure 7B:
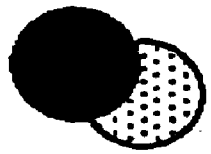
Figure 7B:
Figure 7C:
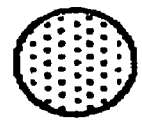
Figure 7C:
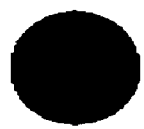
Figure 7C:
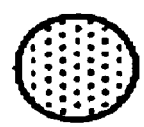
Figure 7C:
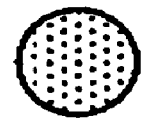

In FIGS. 6B and 7B, parts of the pulse laser beams 601 and 701, which do not irradiate the targets 604 and 704, pass the condensing points. Similarly, in FIGS. 6C and 7C, all of pulse laser beams 601 and 701 pass the condensing points.

Thus, in the conventional configuration that accords an optical axis of the pulse laser beam 101 with that of the EUV light 106 that is generated at the condensing point 103 and incident upon the first mirror 131, when the condenser ellipsoidal mirror 108 has a larger cover angle or size in order to effectively condensing the EUV light, the condensed EUV light is emitted towards the opening of the condenser ellipsoidal mirror. The condensed pulse laser beam does not directly irradiate the condenser ellipsoidal mirror, but directly irradiates the first mirror 131.

For example, suppose that the pulse laser beam is derived from Nd: YAG laser with a wavelength of 1,064 nm, and the mirror 131 forms a multilayer of Mo and Si to reflect the EUV light. Then, the reflectance of the multilayer to the wavelength of 1,064 nm is about 30% at most, and most of the light is absorbed and converted into heat. In this case, the pulse laser beam is not condensed at the first mirror 131, but the pulse laser beam has such a high output as about 5 to 15 kW and injects an considerable amount of heat into the first mirror 131. Therefore, the first mirror 131 becomes at high temperature, and causes thermal deformations and alterations of the multilayer. The imaging performance of the first mirror 131 becomes consequently too deteriorated to provide high-quality exposure, and should be replaced. Since the mirror 131 is housed in the vacuum chamber 190, the replacement requires a release to the atmosphere pressure once, a replacement and adjustment of the first mirror 131, and a draw of vacuum again. Since the illumination and projection optical systems 120 and 122 are precise optical systems, the adjustment is sometimes not limited to the first mirror 131, but the illumination and projection optical systems 120 and 122 should be readjusted, extending the downtime of the apparatus. The above discusses the first mirror 131 which the pulse laser beam directly enters, but the subsequent mirrors may also be subject to replacements due to thermal deformations resulting from the temperature rise and an alteration of the multilayer, although the injected heat is smaller than that of the first mirror 131. In particular, optical elements in the exposure apparatus do not have high heat resistance, and are easily negatively affected by the pulse laser beam.

For example, the condenser mirror 108, the illumination optical system 120, the catoptric reticle 121, and the projection optical system 122 form a several tens of pairs of multilayer made of Mo and Si, etc., on a substrate so as to efficiently reflect the EUV light 106, and its surface roughness is required to be in the angstrom order of in the standard deviation in order to prevent the reflectance from lowering. In addition, the shape precision of the mirror in the projection optical system 122 is required to be in the angstrom order of in the standard deviation in addition to the surface roughness, and the projection optical system 122 should be an extremely precise optical system. Of course, it should be stable to disturbances, such as temperature.

Figure 8A:
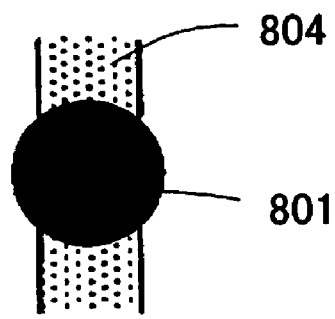
FIG. 8 is still another schematic view for explaining an example that uses excitation laser to irradiate the target.

On the other hand, in order to mitigate the permissible alignment accuracy between the pulse laser beam 101 and the target 104, it is conceivable to make variable a condensing diameter of the pulse laser beam 101. FIGS. 8A and 8B show a case where the pulse laser beams 801 and 811 are larger than the targets 804 and 814. FIG. 8A shows that the nozzle jets rod-shaped Xe liquid shown in FIG. 5B, and FIG. 8B shows that the nozzle jets Xe droplets shown in FIG. 5C. Since the pulse laser beam is larger than the target in both cases, the pulse laser beam may irradiate the target entirely even with a little positional offset between them. However, part of the pulse laser beam necessarily proceeds without irradiating the target, and highly possibly damages other components in the apparatus as discussed above.

Figure 8C:
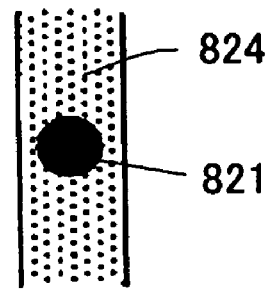
Figure 8B:
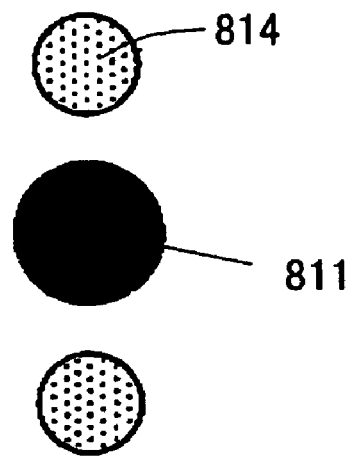
Figure 8D:
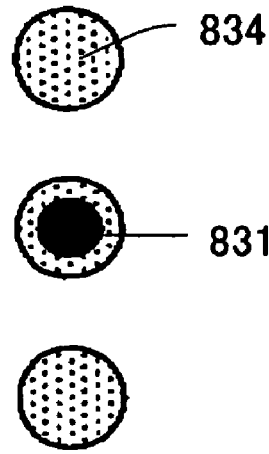

On the other hand, FIGS. 8C and 8D show a case where the pulse laser beams 821 and 831 are smaller than the targets 824 and 834. FIG. 8C shows that the nozzle jets rod-shaped Xe liquid shown in FIG. 5B, and FIG. 8D shows that the nozzle jets Xe droplets shown in FIG. 5C. Since the pulse laser beam is smaller than the target in both cases, all of pulse laser beam may irradiate the target entirely even with a little positional offset between them and there is no problem associated with FIGS. 8A and 8B. However, it is not easy to increase the size of the target, and a new problem arises in that power of the EUV light and thus the throughput reduce by the reduction amount of a condensing diameter of the pulse laser beams 821, 831.

It is thus preferable that the pulse laser beam is equal in size to the target, as shown in FIG. 5.

Of course, in the conventional configuration where the optical axis of the pulse laser beam 101 accords with the optical axis of the EUV light 106 that is generated at the emission point 103 and incident upon the first mirror 131, an unforeseen case occurs in which all or part of the pulse laser beam passes through the condensing point 103 for reasons other than a positional offset between them. For example, the target supply system shown in FIG. 5C might have poor synchronous controllability between the liquid target 524 and the pulse laser 501, and a discordance may occur between the pulse laser emission period and the liquid drop period. Alternatively, the target 524 may be not supplied due to a failure of the target supply system 522 itself. Moreover, even part of the pulse laser that completely irradiates the target possibly maintains a component of going straight ahead as a result of non-interaction between the pulse laser and the target. Either case negatively affects the illumination and projection optical systems 120 and 122 significantly, as discussed above.

The instant embodiment shown in FIG. 1 solves the above problems by offsetting an optical-axis direction AA' of the laser beam 101 from an optical-axis direction 109 of the EUV light 106 that is generated at the condensing point 103 and incident upon the first mirror 131, and by providing the condenser ellipsoidal mirror with passage part through which the pulse laser beam incident upon the target passes, passage part through which the pulse laser beam goes beyond the target. 170 is means for three-dimensionally inclining the optical-axis direction of the pulse laser beam 101 relative to the optical-axis direction 109 of the EUV light 106. The term "three-dimensionally" purports that it includes, for example, a case where the optical-axis direction AA' is not on the same paper surface as FIG. 1, e.g., perpendicular to the paper of FIG. 1. Such an embodiment will be discussed later with reference to FIG. 9. The optical-axis direction of the pulse laser beam 101 is an incidence direction of the pulse laser beam 101 onto the target 104. The instant embodiment determines the direction AA' such that the pulse laser beam 101 that goes beyond the target 104 does not interfere with other components, such as the illumination optical system 120, the projection optical system 122, the reticle stage 124, and the wafer stage 125.

The passage part in the condenser ellipsoidal mirror maintains an optical path of the pulse laser such that the incident and exit pulse lasers do not interfere with the condenser ellipsoidal mirror.

The instant embodiment shown in FIG. 1 solves the problem by offsetting by an angle of 5° or more the optical-axis direction AA' of the laser light 101 from the optical-axis direction 109 of the EUV light 106 that is generated at the condensing point 103 and incident onto the first mirror 131. "5°" purports that the optical-axis direction AA' of the laser beam 101 is inclined relative to the optical-axis direction 109 intentionally (that is, not because of an error at the time of installment).

The instant embodiment arranges an opening of the condenser ellipsoidal mirror 108 closer to the first mirror 131 side than the condensing point 103 of the excitation laser 101 in the optical-axis direction 109 of the EUV light 106.

It is preferable to arrange a stopper 150 on the optical axis AA', for shielding a propagation of the pulse laser beam 101 and absorbs the pulse laser beam 101. Desirably, in order to avoid secondary irradiation as a result of reflections on the stopper 150, the stopper 150 is made of materials or has a shape for absorbing the pulse laser beam 101 without reflecting the laser beam 101. Since the pulse laser beam 101 has such a large output as about 5 to 15 kW and the stopper 150 absorbs a large amount of heat, it is desirable to provide the stopper 150 with a cooling mechanism. More specifically, a channel 151 is provided around the stopper 150 to circulate temperature-regulated fluid, such as liquid and gas, conduct heat exchanges with the fluid, and exhaust the heat outside the apparatus.

Thus, the pulse laser beam 101 does not irradiate or damage other components including the condenser ellipsoidal mirror 108, the first mirror 131 and other components by aligning the optical axis of the pulse laser beam 101 with the direction AA', providing the condenser ellipsoidal mirror 108 with passage part through which the pulse laser beams that enter or exit the target 104 pass, and arranging the stopper 150 that includes a cooling mechanism, even when the pulse laser beam 101 does not irradiate the target 104 at all or irradiates only part of the target 104, or when the pulse laser does not interact with the target and remains beyond the target. As a result, the working efficiency of the apparatus is prevented from being lowered, by avoiding a replacement and readjustment of a significantly damaged component which results in the long downtime of the apparatus because it requires a release of the vacuum chambers 180 and 190 to the atmosphere pressure, a replacement and readjustment of the component, and then a draw of vacuum again for recovery.

In addition, the passage enables the ellipsoidal mirror to be large.

The EUV light 106 that has been introduced into the vacuum chamber 190 illuminates, through the illumination optical system 120, the cataoptric reticle 121 having a predetermined pattern. The illumination optical system 120 serves to propagate the EUV light and illuminate the catoptric reticle 121, and includes plural mirrors including the first mirror 131, an optical integrator, and an aperture. The first mirror 131 gathers approximately isotropically emitted EUV light. The optical integrator serves to evenly illuminate the catoptric reticle 121 with a predetermined numerical aperture. The aperture is provided at a position conjugate with the catoptric reticle 121, and limits an area to illuminate the catoptric reticle 121 to an arc shape.

The EUV light 106 that has been selectively reflected on the catoptric reticle 121 is reduced and projected onto the wafer 123 onto which resist has been applied, through the projection optical system 122 including plural mirrors. As a result, the pattern on the catoptric reticle 121 is transferred onto the wafer 123.

The illumination area on the catoptric reticle 121 and the projected image onto the wafer 123 have an extremely narrow arc shape having the same image point, so as to obtain a good image by restraining aberration of the projection optical system 122. Thus, the instant exposure apparatus adopts a so-called scan exposure method, which scans the reticle stage 124 and the wafer stage 125 synchronously during exposure.

Second Embodiment

Figure 2:
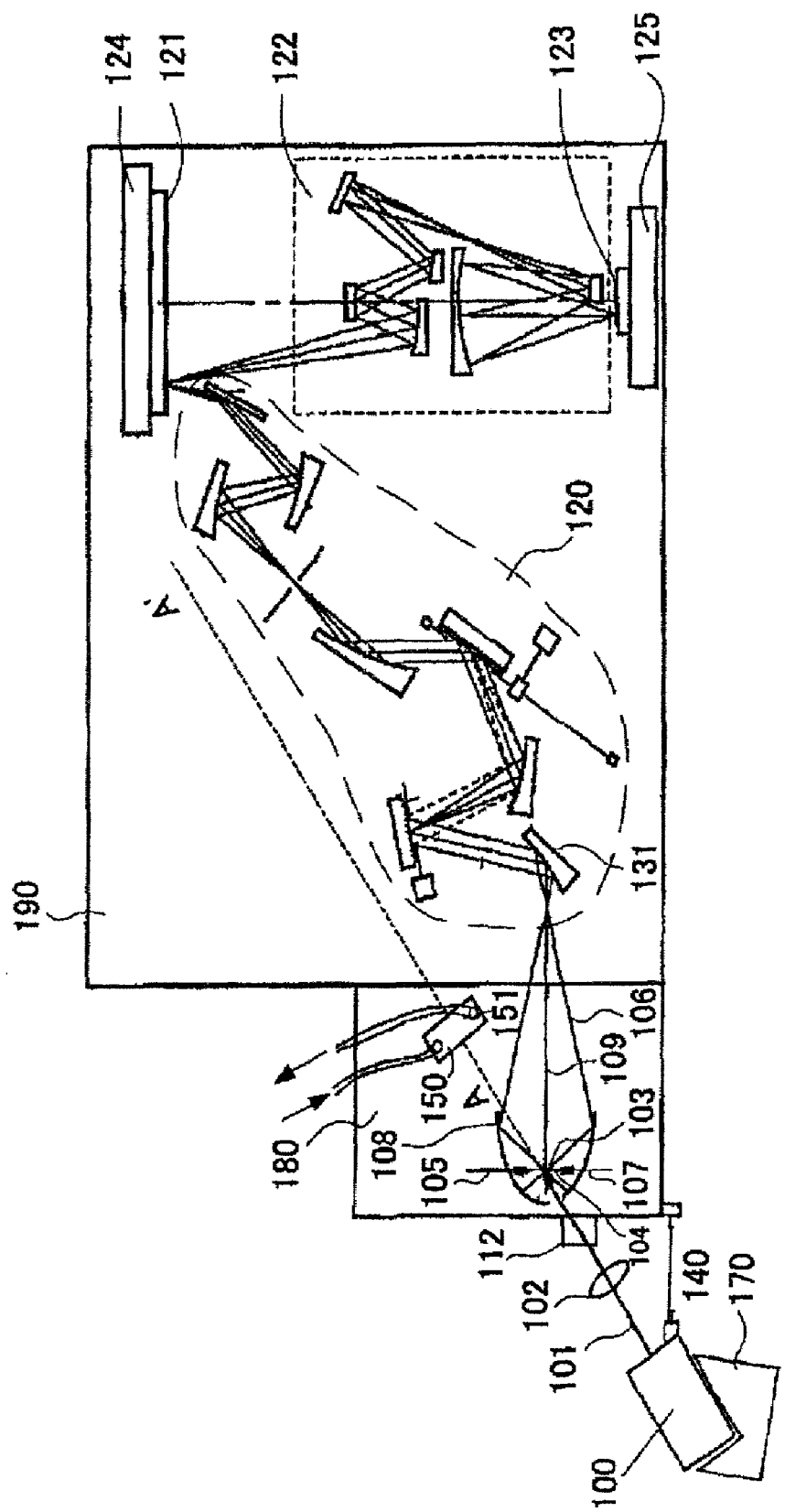
FIG. 2 is a schematic plane view of an exposure apparatus of a second embodiment according to the present invention.

Referring now to FIG. 2, a description will be given of the second embodiment according to the present invention. Those elements in FIG. 2 which are the same as corresponding elements in FIG. 1 are designated by the same reference numerals, and a description thereof will be omitted. In the instant embodiment, the optical-axis direction AA' of the laser beam 101 is offset from the optical-axis direction 109 of the EUV light 106 that is generated at the condensing point 103 and incident upon the first mirror 131, such that the EUV light does not interfere with other components including the condenser ellipsoidal mirror 108. In particular, the pulse laser that has been emitted from the target is designed to pass the opening in the condenser ellipsoidal mirror, through which the condensed EUV light passes. Moreover, the condenser ellipsoidal mirror is equipped with the passage part, through which the pulse laser beam that enters the target passes. In this case, the number of passage parts in the condenser ellipsoidal mirror is set to be one, and facilitate the manufacture.

The instant embodiment shown in FIG. 2 solves the problem by offsetting by an angle of 5° or more the optical-axis direction AA' of the laser light 101 from the optical-axis direction 109 of the EUV light 106 that is generated at the condensing point 103 and incident onto the first mirror 131. "5°" purports that the optical-axis direction AA' of the laser beam 101 is inclined relative to the optical-axis direction 109 intentionally (that is, not because of an error at the time of installment).

The instant embodiment arranges the opening of the condenser ellipsoidal mirror 108 closer to the first mirror 131 side than the condensing point 103 of the excitation laser 101 in the optical-axis direction 109 of the EUV light 106.

It is preferable that a diameter of the passage part is below $1/20$ of a diameter of the opening.

Third Embodiment

Figure 3:
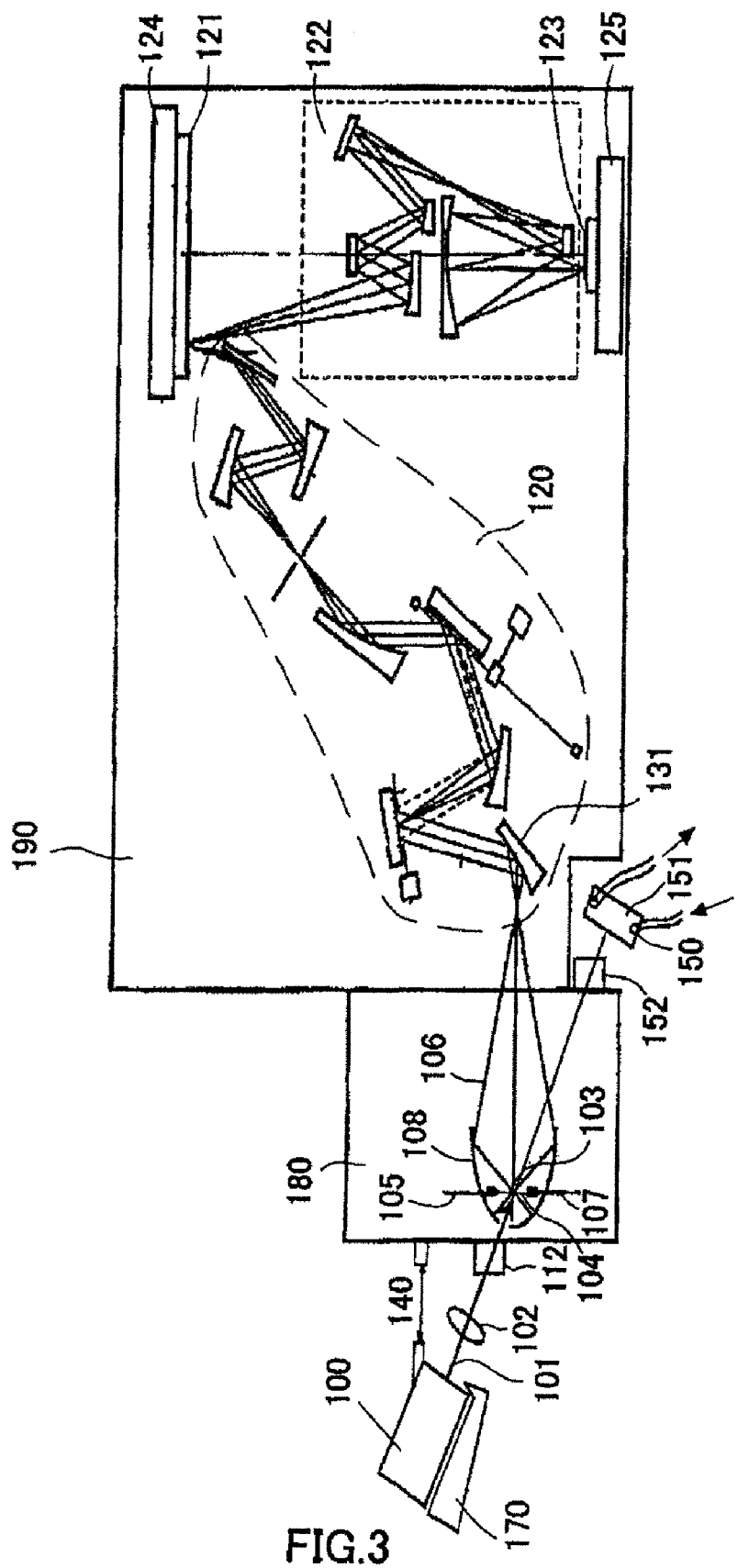
FIG. 3 is a schematic plane view of an exposure apparatus of a third embodiment according to the present invention.

Referring now to FIG. 3, a description will be given of a third embodiment according to the present invention. This embodiment inclines the laser light source 100 in a direction reverse to that in FIG. 2, and arranges the stopper 150 outside the vacuum chambers 180 and 190. Therefore, the vacuum chamber 180 or 190 is provided with a window 152 to deliver the pulse laser beam 101. The window 152 is preferably made of materials such as quarts that has high transmittance to the pulse laser beam 101. Since the stopper 150 is installed in the air, and thus more easily handled than the vacuum environment from a viewpoint of the thermal process.

Fourth Embodiment

Figure 4:
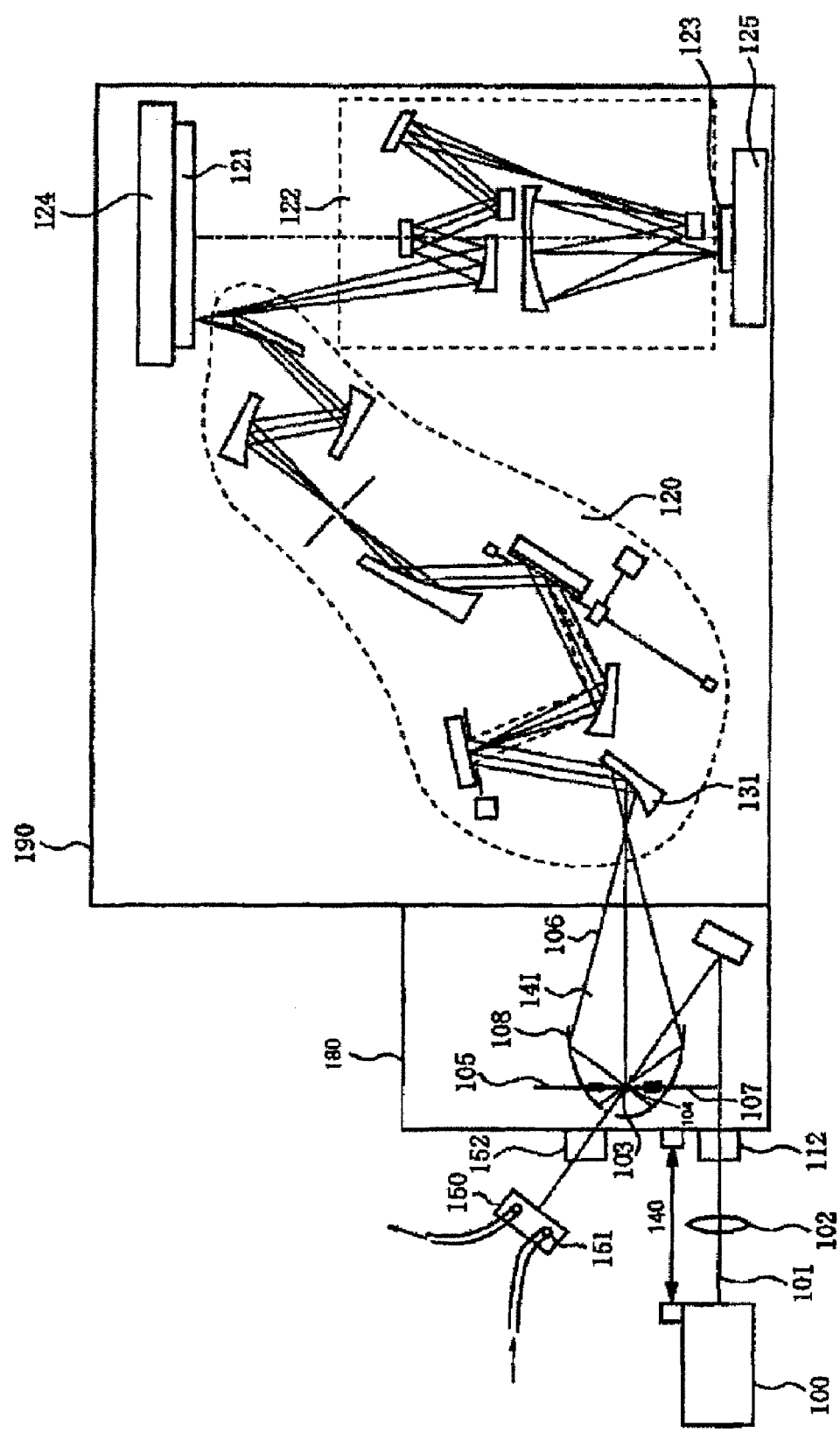
FIG. 4 is a schematic plane view of an exposure apparatus of a fourth embodiment according to the present invention.

Referring now to FIG. 4, a description will be given of a fourth embodiment according to the present invention. This embodiment determines an optical axis of the pulse laser to the target such that the pulse laser beam goes to the target 104 through the opening of the condenser ellipsoidal mirror, through which the condensed EUV light passes, and the condenser ellipsoidal mirror is provided with the passage part, through which the pulse laser beam that exits the target 104 passes. Therefore, similar to the second embodiment, the stopper 150 is easily arranged outside the vacuum chambers 180 and 190, and a propagation direction of the pulse laser beam beyond the target is opposite to the other components including the illumination and projection systems. Advantageously, a space for arranging the stopper is easily maintained.

Fifth Embodiment

Figure 9A:
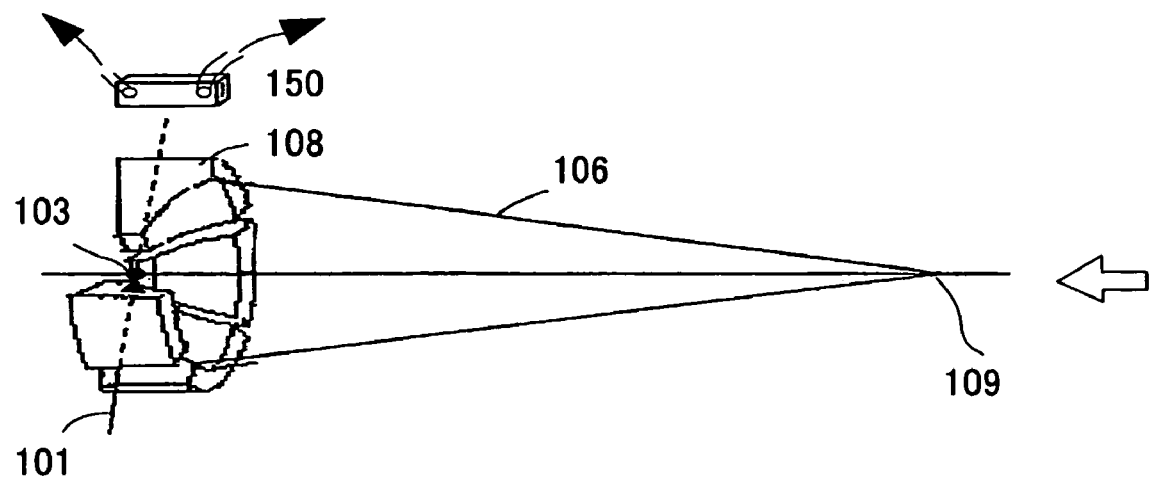
FIG. 9 is a schematic plane view of an exposure apparatus of a fifth embodiment according to the present invention.

Referring now to FIG. 9, a description will be given of a fifth embodiment according to the present invention. FIG. 9 shows the inside of the vacuum chamber 180 in detail. The instant embodiment arranges the optical-axis direction AA' of the laser beam 101 perpendicular to the paper surface of FIG. 1. More specifically, the pulse laser beam 101 is introduced to the condensing point 103 in a direction shown in FIG. 9A, and the stopper 150 is arranged beyond the condensing point 103. Similar to FIGS. 1 to 4, the stopper 150 is arranged in vacuum or atmosphere environment. The condenser mirror 108 for the EUV light is an object mirror for condensing the EUV light that is derived from the plasma generated at the condensing point 103, and its shape is a portion of the spheroid having a focal point at the condensing points 103 and 109. Since it is difficult to precisely process, measure, and film such a special shape having large curvature as the spheroid, the condenser mirror is divided, as shown in FIG. 9A, into six parts, for example, so as to make each curvature relatively small. Then, these parts are precisely processed, measured, and filmed, and then combine them so as to provide them with functions of the condenser mirror 108.

Figure 9B:
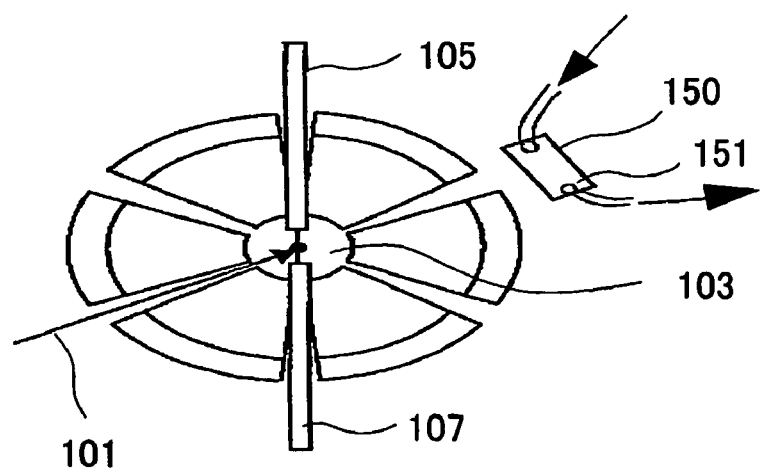

As shown in FIGS. 9A and 9B, the instant embodiment introduces, instead of forming the passages shown in FIGS. 1 to 4, the pulse laser toward the target through gaps as the passage part among divided parts of the condenser ellipsoidal mirror, and enables the pulse laser to emit from the target. The target supply systems 105 and 107 may be formed similarly such that the laser beam passes through the gaps among parts. Here, FIG. 9A is a schematic perspective view of this embodiment where the pulse laser beam 101 is introduced perpendicular to the paper of FIG. 1, and FIG. 9B is a schematic plane view of FIG. 9A when viewed from an arrow direction.

Sixth Embodiment

Figure 10:
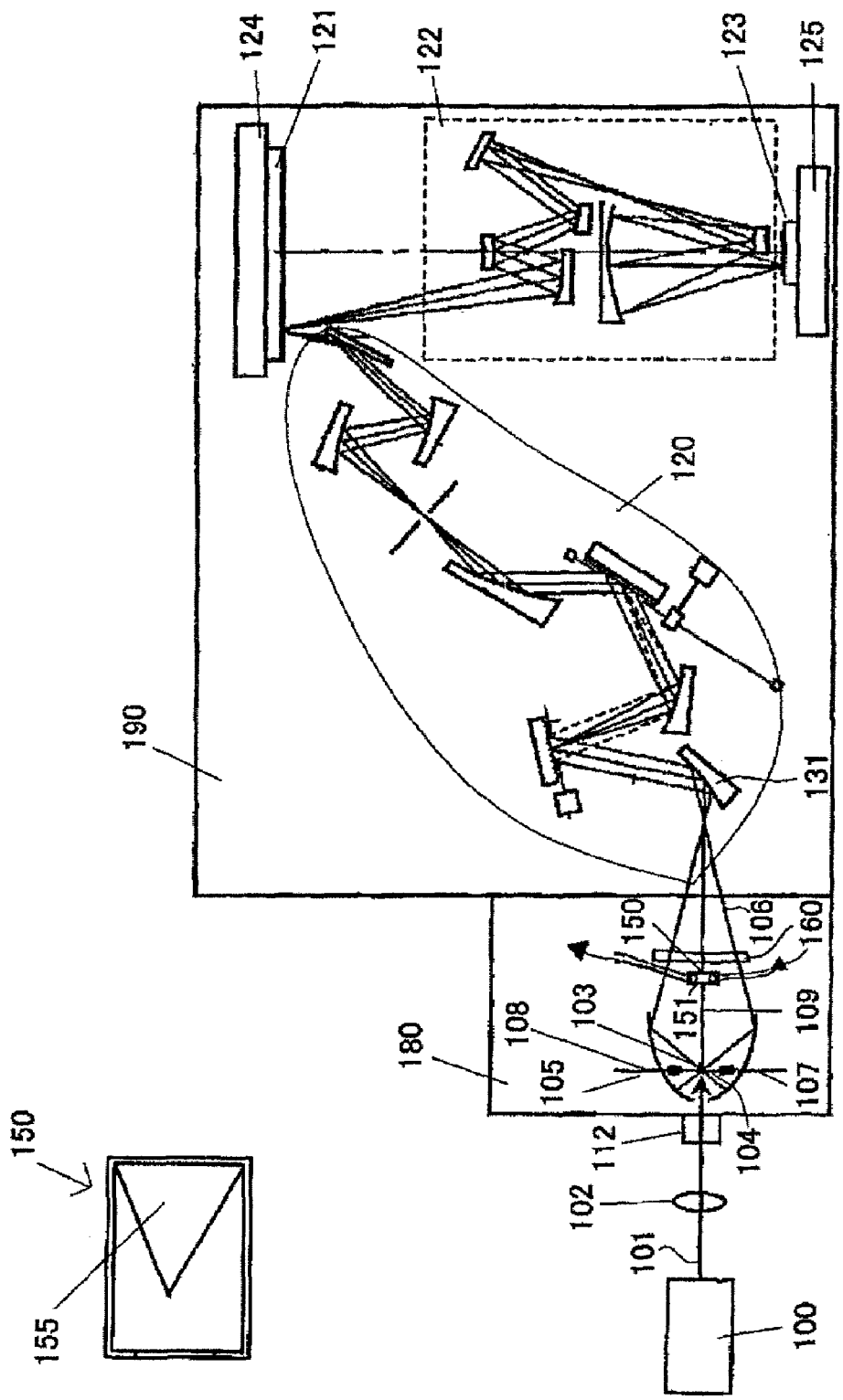
FIG. 10 is a schematic plane view of an exposure apparatus of a sixth embodiment according to the present invention.

Referring now to FIG. 10, a description will be given of an exposure apparatus of a sixth embodiment according to the present invention. FIG. 10 is a schematic plane view showing an example in which the optical-axis direction AA' of the pulse laser light 101 accords with the optical-axis direction 109 of the EUV light, and the stopper 150 and debris filter 160 are provided in the optical-axis direction. YAG laser has a beam diameter of about 100 μm and NA of about 0.01. The debris filter 160 may be a thin film made, for example, of molybdenum, beryllium, zirconium, etc., and having a thickness of 0.1 to 0.2 μm and the transmittance between about 50% and 70% to the EUV light, and of approximately 100% to the YAG laser.

The stopper 150 includes a metal member and an antireflective coating on the metal member, and has a thickness of about 10 to 20 nm, and a size of about φ 10 to 20 mm. This size is convenient since it does not shield the EUV light 106. A diffuser shown in FIG. 10 is also applicable. A triangle part 155 reflects laser, and absorbs it as a result of multiple reflection. The stopper 150 has a size of about 50×50×50 mm to about 100×100×100 mm.

While this embodiment forms the debris filter 160 and the stopper 150 as separate members, both members may be integrated. The debris filter is not limited to a thin film, and may apply other forms.

Seventh Embodiment

Figure 11:
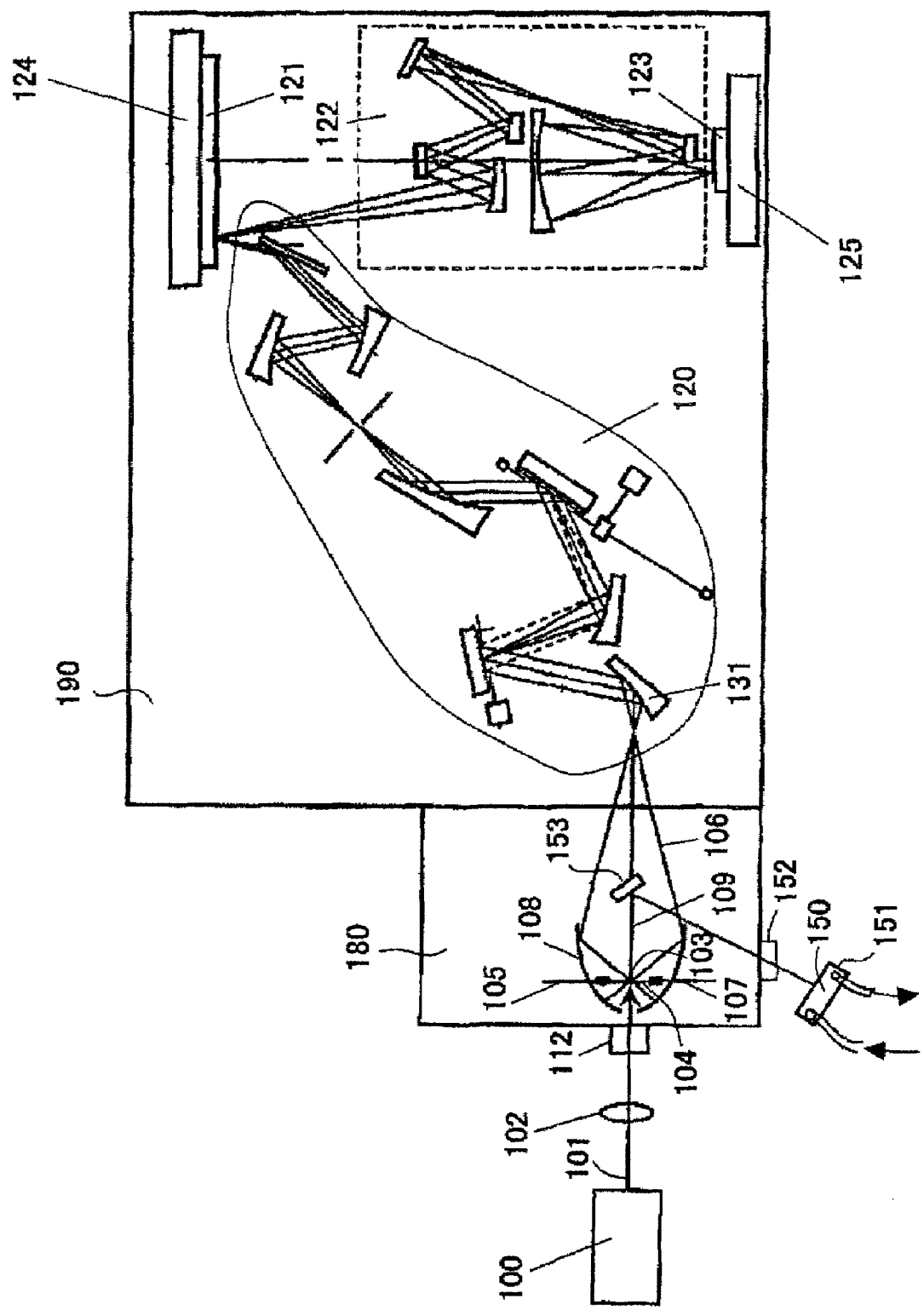
FIG. 11 is a schematic plane view of an exposure apparatus of a seventh embodiment according to the present invention.

Referring now to FIG. 11, a description will be given of an exposure apparatus the seventh embodiment according to the present invention. FIG. 11 is a schematic plane view showing an example in which the optical-axis direction AA' of the pulse laser beam 101 accords with the optical-axis direction 109 of the EUV light, and the reflective member 157 is provided on the optical-axis direction 109. As discussed, YAG laser has a beam diameter of about 100 μm and NA of about 0.01. The reflective member 157 is made of materials having high reflectance (e.g., 99% or higher), such as Au, Ag and Cu, and has a thickness of about 10 to 20 mm, and a size of about φ 10 to 20 mm. This size is convenient since it does not shield the EUV light 106.

Figure 12:
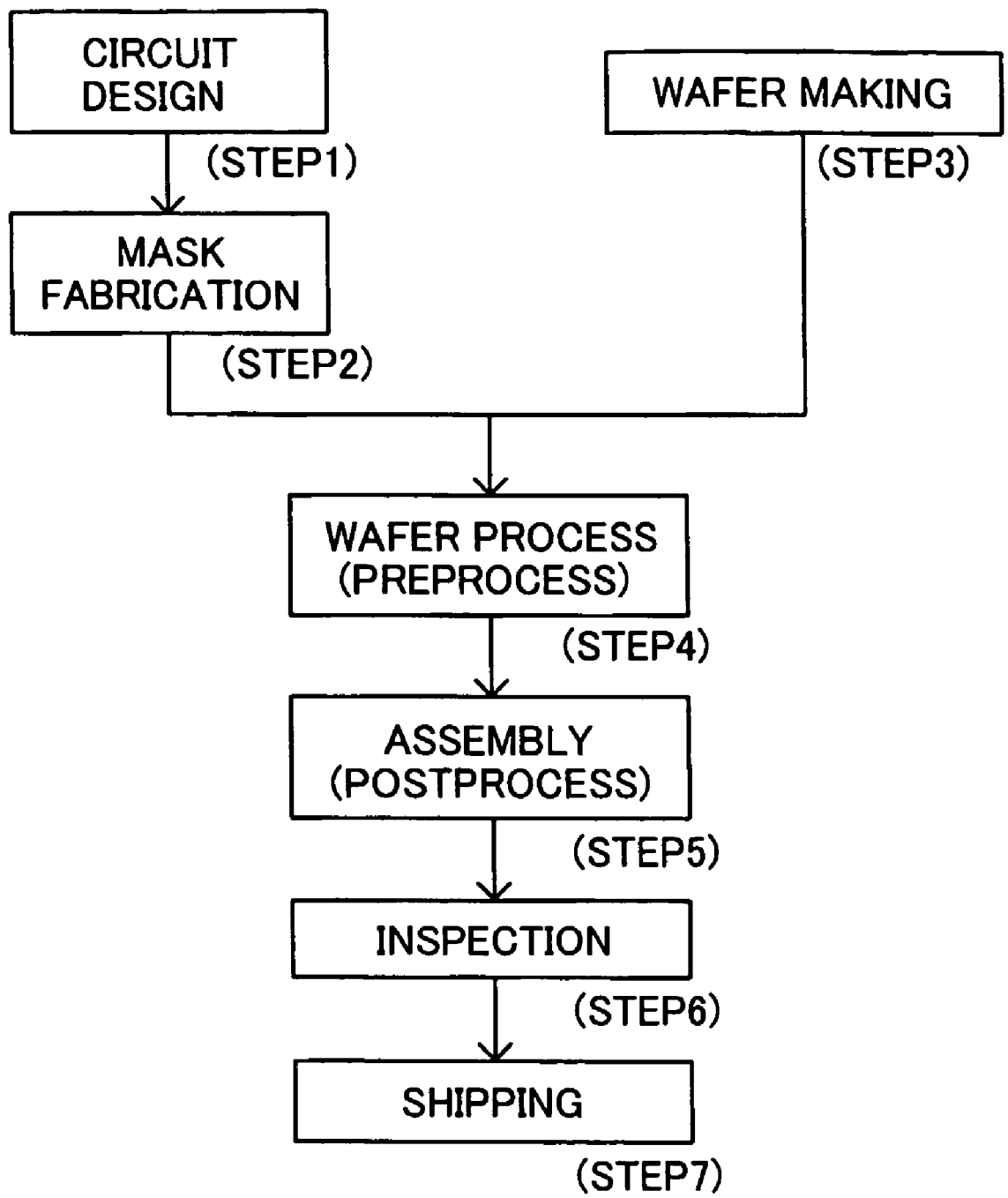
FIG. 12 is a flowchart for explaining a method for fabricating devices (semiconductor chips such as ICs, LSIs, and the like, LCDs, CCDs, etc.).
Figure 13:
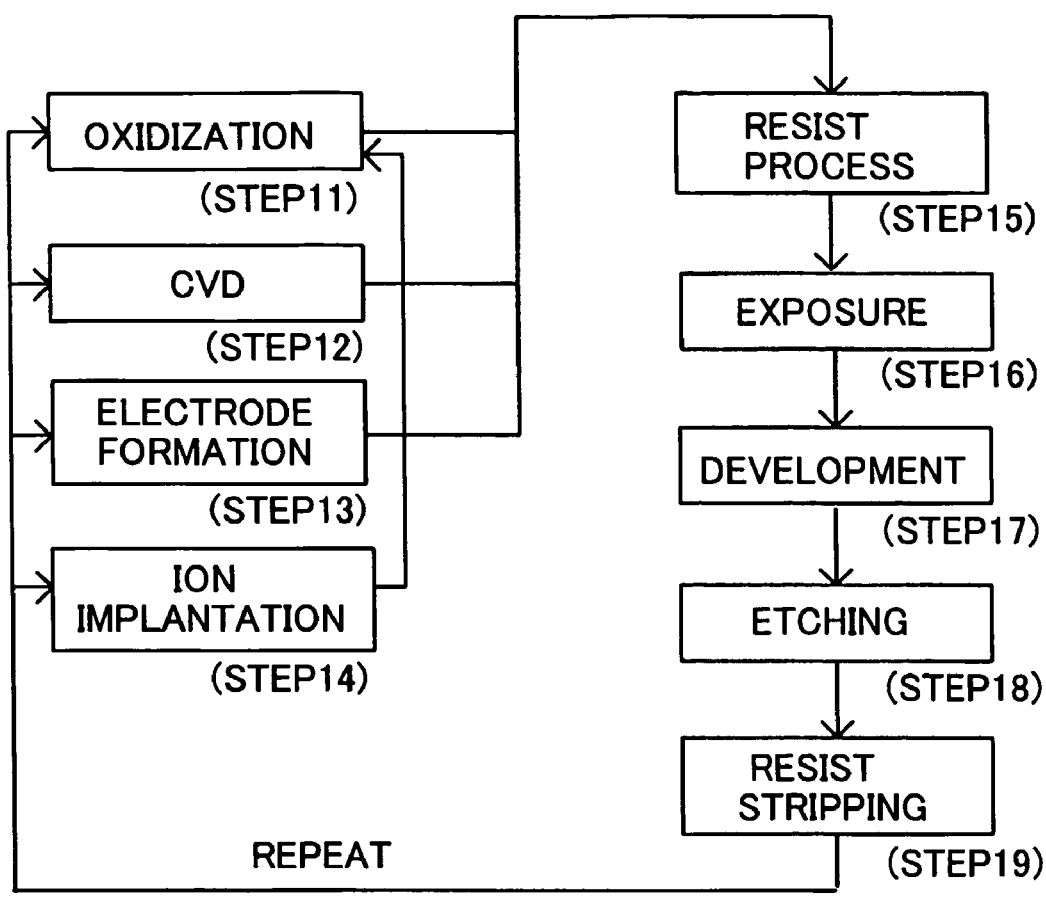
FIG. 13 is a detailed flowchart for Step 4 of wafer process shown in FIG. 12.

Referring to FIGS. 12 and 13, a description will now be given of an embodiment of a device fabricating method using the above exposure apparatus. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (catopric reticle fabrication) forms a catoptric reticle having a designed circuit pattern. Step 3 (wafer preparation) manufactures a wafer using materials such as silicon. Step 4 (wafer process) which is referred to as a pretreatment, forms actual circuitry on the wafer through photolithography using the catoptric reticle and wafer. Step 5 (assembly) which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4 shown in FIG. 12. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the catoptric reticle onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one, by restraining a surface-shape change of the optical element in the projection optical system and correcting a deterioration of the optical performance. Thus, the device fabrication method using the exposure apparatus and the devices as finished goods also constitute one aspect of the present invention. The device fabrication method of the instant embodiment prevents thermal deformations and damages of optical elements, such as the condenser ellipsoidal mirror 108 and the first mirror 131 in the illumination optical system 120, while increasing the cover angle of the condenser ellipsoidal mirror to efficiently condense the EUV light, thereby manufacturing high-quality devices with high productivity. Thus, a device fabrication method using this exposure apparatus and resultant devices constitute one aspect of the present invention.

Further, the present invention is not limited to these preferred embodiments, and various variations and modifications may be made without departing from the scope of the present invention.

While the instant embodiment uses an ellipsoidal shape for a mirror that condenses the EUV light, the present invention does not limit the shape of the mirror to the ellipsoidal shape. It is sufficient that the inventive condenser mirror condenses the EUV light in front of the first mirror in the illumination optical system.

The above preferred first to seventh embodiments provide the following effects:

A direction of an optical axis of the excitation laser is determined such that when the excitation laser goes straight ahead beyond the target the light does not irradiate other components including the condenser ellipsoidal mirror and optical systems in the exposure apparatus. The condenser ellipsoidal mirror for condensing the EUV light is provided with passage part through which the excitation lasers that enter and/or exit the target pass. The stopper that shields and absorbs the excitation laser and includes a cooling mechanism is provided inside or outside the vacuum chamber. Thus, the other components including the condenser ellipsoidal mirror are prevented from getting damaged even when the excitation laser proceeds beyond the target.

In addition, the working efficiency of the apparatus is prevented from being lowered, by avoiding a replacement and readjustment of a significantly damaged component which results in the long downtime of the apparatus because it requires a release of the vacuum chamber to the atmosphere pressure, a replacement and readjustment of the component, and a draw of vacuum again for recovery.

Moreover, since the passage part may avoid the above significant damages, and enlarge the cover angle or size of the condenser ellipsoidal mirror for the EUV light, more power of the EUV light may be supplied to the wafer. Thus, the EUV light may be condensed efficiently and the exposure apparatus may have improved productivity and throughput of the exposure apparatus.

INDUSTRIAL APPLICABILITY

Thus, the present invention determines a direction of an optical axis of the excitation laser such that when the excitation laser goes straight ahead beyond the target the light does not irradiate other components including the condenser mirror and optical systems in the exposure apparatus, and the other components including the condenser ellipsoidal mirror are prevented from getting damaged even when the excitation laser proceeds beyond the target.

The invention claimed is:

1. An exposure apparatus that irradiates excitation laser beam onto a target, and generates from generated plasma a light source for generating illumination light of an extreme ultraviolet region or an X-ray region, said exposure apparatus comprising:
   an illumination optical system that uses the illumination light to illuminate a reflection reticle, said illumination optical system including a first mirror;
   a condenser mirror that condenses the illumination light from the light source and directs the illumination light to the first mirror;
   a projection optical system that reduces and projects a pattern of the reflection reticle onto an object to be exposed,
   wherein the excitation laser beam exiting from the target passes through a passage part in said condenser mirror, and the excitation laser beam incident upon the target passes through an opening of said condenser mirror thorough which the illumination light passes.

2. The exposure apparatus according to claim 1, wherein said condenser mirror includes an ellipsoidal mirror.

3. An exposure apparatus that irradiates excitation laser beam onto a target, and generates from generated plasma a light source for generating illumination light of an extreme ultraviolet region or an X-ray region, said exposure apparatus comprising:
   an illumination optical system that uses the illumination light to illuminate a reflection reticle, said illumination optical system including a first mirror;
   a condenser mirror that condenses the illumination light from the light source and directs the illumination light to the first mirror;
   a projection optical system that reduces and projects a pattern of the reflection reticle onto an object to be exposed;
   a stopper that prevents the excitation laser beam from reaching the illumination optical system beyond the target; and
   a cooling mechanism for cooling said stopper.

4. The exposure apparatus according to claim 3, wherein said stopper includes an antireflective coating on a metal member.

5. The exposure apparatus according to claim 3, wherein said stopper is located outside a chamber that houses said illumination and projection optical systems.

6. The exposure apparatus according to claim 3, wherein said condenser mirror includes an ellipsoidal mirror.

* * * * *

UNITED STATES PATENT AND TRADEMARK OFFICE
CERTIFICATE OF CORRECTION

PATENT NO. : 7,274,435 B2
APPLICATION NO. : 10/512312
DATED : September 25, 2007
INVENTOR(S) : Mitsuru Hiura et al.

It is certified that error appears in the above-identified patent and that said Letters Patent is hereby corrected as shown below:

In Column 14, Line 34, change "thorough" to --through--.

Signed and Sealed this

First Day of April, 2008

JON W. DUDAS
*Director of the United States Patent and Trademark Office*